(12) United States Patent
Taylor et al.

(10) Patent No.: US 7,777,607 B2
(45) Date of Patent: Aug. 17, 2010

(54) RESISTOR HAVING A PREDETERMINED TEMPERATURE COEFFICIENT

(75) Inventors: William P. Taylor, North Andover, MA (US); Michael C. Doogue, Manchester, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 1174 days.

(21) Appl. No.: 10/962,889

(22) Filed: Oct. 12, 2004

(65) Prior Publication Data
US 2006/0077598 A1    Apr. 13, 2006

(51) Int. Cl.
H01L 43/00    (2006.01)
(52) U.S. Cl. .................................................. 338/32 R
(58) Field of Classification Search ............... 338/32 R, 338/32 H, 12, 68, 89, 118, 196; 360/324.11; 324/252
See application file for complete search history.

(56) References Cited

U.S. PATENT DOCUMENTS

| | | | |
|---|---|---|---|
| 3,858,189 A | 12/1974 | Beausoleil et al. | |
| 3,860,965 A | 1/1975 | Voegeli | |
| 4,035,785 A | 7/1977 | Kryder | |
| 4,078,230 A | 3/1978 | George | |
| 4,159,537 A | 6/1979 | Schwartz | |
| 4,343,026 A | 8/1982 | Griffith et al. | |
| 4,432,069 A | 2/1984 | Rose et al. | |
| 4,525,668 A | 6/1985 | Lienhard et al. | |
| 4,596,950 A | 6/1986 | Lienhard et al. | |
| 4,691,259 A | 9/1987 | Imakoshi | |
| 4,712,064 A | 12/1987 | Eckardt et al. | |
| 4,823,075 A | 4/1989 | Alley | |
| 4,847,584 A | 7/1989 | Pant | |
| 4,860,432 A | 8/1989 | Kawata | |
| 4,937,521 A | 6/1990 | Yoshino et al. | |
| 4,939,449 A | 7/1990 | Cattaneo et al. | |
| 4,939,459 A | 7/1990 | Akachi et al. | |
| 5,041,780 A | 8/1991 | Rippel | |
| 5,049,809 A | 9/1991 | Wakatsuki et al. | |
| 5,227,721 A | 7/1993 | Kataoka et al. | |
| 5,260,653 A | 11/1993 | Smith et al. | |
| 5,500,590 A | 3/1996 | Pant | |
| 5,561,368 A * | 10/1996 | Dovek et al. ............... | 338/32 R |

(Continued)

FOREIGN PATENT DOCUMENTS

DE    42 12 737    7/1993

(Continued)

OTHER PUBLICATIONS

Hirota et al.; "Giant Magneto-Resistance Devices;" Springer Series in Surface Sciences, 40; ISBN-10:3540418199; ISBN-13: 9783540418191; pp. 10-77.

(Continued)

*Primary Examiner*—Elvin G Enad
*Assistant Examiner*—Joselito Baisa
(74) *Attorney, Agent, or Firm*—Daly, Crowley, Mofford & Durkee, LLP

(57) ABSTRACT

A material stack has an electrical resistance generally the same in the presence of a magnetic field and in the presence of no magnetic field. The electrical resistance of the material stack has a temperature coefficient generally the same as a magnetoresistance element.

12 Claims, 4 Drawing Sheets

U.S. PATENT DOCUMENTS

| | | | |
|---|---|---|---|
| 5,570,034 A | 10/1996 | Needham et al. | |
| 5,583,725 A * | 12/1996 | Coffey et al. | 338/32 R |
| 5,617,071 A | 4/1997 | Daughton | |
| 5,621,377 A | 4/1997 | Dettmann et al. | |
| 5,686,838 A | 11/1997 | van den Berg | |
| 5,719,494 A | 2/1998 | Dettmann et al. | |
| 5,831,426 A | 11/1998 | Black, Jr. et al. | |
| 5,877,705 A | 3/1999 | Sampey | |
| 5,945,825 A * | 8/1999 | Clemens | 338/32 R |
| 5,952,825 A | 9/1999 | Wan | |
| 6,002,553 A | 12/1999 | Stearns et al. | |
| 6,021,065 A | 2/2000 | Daughton et al. | |
| 6,031,273 A | 2/2000 | Torok et al. | |
| 6,100,686 A * | 8/2000 | Van Delden et al. | 338/32 R |
| 6,175,296 B1 * | 1/2001 | Tokunaga et al. | 338/12 |
| 6,300,617 B1 | 10/2001 | Daughton et al. | |
| 6,315,875 B1 | 11/2001 | Sasaki | |
| 6,316,931 B1 | 11/2001 | Nakagawa et al. | |
| 6,323,634 B1 | 11/2001 | Nakagawa et al. | |
| 6,329,818 B1 * | 12/2001 | Tokunaga et al. | 338/32 R |
| 6,331,773 B1 * | 12/2001 | Engel | 338/32 R |
| 6,392,852 B1 | 5/2002 | Sasaki | |
| 6,404,191 B2 | 6/2002 | Daughton et al. | |
| 6,411,078 B1 | 6/2002 | Nakagawa et al. | |
| 6,429,640 B1 | 8/2002 | Daughton et al. | |
| 6,437,558 B2 | 8/2002 | Li et al. | |
| 6,445,171 B2 | 9/2002 | Sandquist et al. | |
| 6,459,255 B1 | 10/2002 | Tamai et al. | |
| 6,462,541 B1 | 10/2002 | Wang et al. | |
| 6,501,678 B1 | 12/2002 | Lenssen et al. | |
| 6,566,856 B2 | 5/2003 | Sandquist et al. | |
| 6,591,481 B2 | 7/2003 | Shimazawa et al. | |
| 6,642,705 B2 | 11/2003 | Kawase | |
| 6,657,826 B2 | 12/2003 | Shimazawa et al. | |
| 6,664,785 B2 | 12/2003 | Kohlstedt | |
| 6,667,682 B2 | 12/2003 | Wan et al. | |
| 6,693,826 B1 | 2/2004 | Black et al. | |
| 6,721,140 B2 | 4/2004 | Inoue et al. | |
| 6,759,841 B2 | 7/2004 | Goto et al. | |
| 6,781,359 B2 | 8/2004 | Stauth et al. | |
| 6,788,568 B2 | 9/2004 | Hidaka | |
| 6,967,798 B2 | 11/2005 | Homola et al. | |
| 6,970,333 B2 | 11/2005 | Boeve | |
| 7,071,074 B2 | 7/2006 | Schmidt et al. | |
| 7,248,045 B2 | 7/2007 | Shoji | |
| 7,259,545 B2 | 8/2007 | Stauth et al. | |
| 7,336,064 B2 | 2/2008 | Ludwig et al. | |
| 7,495,624 B2 | 2/2009 | Daalmans | |
| 2002/0024337 A1 | 2/2002 | Levert et al. | |
| 2002/0180433 A1 | 12/2002 | Van Zon et al. | |
| 2002/0186011 A1 | 12/2002 | Murata et al. | |
| 2004/0023064 A1 | 2/2004 | Ehresmann et al. | |
| 2004/0137275 A1 | 7/2004 | Jander et al. | |
| 2005/0007834 A1 | 1/2005 | Hidaka | |
| 2006/0071655 A1 | 4/2006 | Shoji | |
| 2006/0077598 A1 | 4/2006 | Taylor et al. | |
| 2006/0087318 A1 | 4/2006 | Crolly et al. | |
| 2006/0091993 A1 | 5/2006 | Shoji | |
| 2006/0114098 A1 | 6/2006 | Shoji | |
| 2006/0145690 A1 | 7/2006 | Shoji | |
| 2006/0170529 A1 | 8/2006 | Shoji | |
| 2006/0291106 A1 | 12/2006 | Shoji | |
| 2007/0044370 A1 | 3/2007 | Shoji | |
| 2007/0076332 A1 | 4/2007 | Shoji et al. | |
| 2007/0090825 A1 | 4/2007 | Shoji | |
| 2007/0096716 A1 | 5/2007 | Shoji | |
| 2007/0134921 A1 | 6/2007 | Tian et al. | |
| 2007/0188946 A1 | 8/2007 | Shoji | |
| 2007/0247144 A1 | 10/2007 | Tokuhara et al. | |
| 2007/0247943 A1 | 10/2007 | Sato et al. | |
| 2008/0309331 A1 | 12/2008 | Qian et al. | |

FOREIGN PATENT DOCUMENTS

| | | |
|---|---|---|
| DE | 196 50 078 | 6/1998 |
| DE | 100 17 374 B4 | 12/2000 |
| DE | 101 59 607 A1 | 9/2002 |
| DE | 101 28 150 C1 | 1/2003 |
| DE | 10 155 423 B4 | 5/2003 |
| DE | 102 02 287 C1 | 8/2003 |
| DE | 102 22 395 A1 | 12/2003 |
| DE | 10 2004 003 369 A1 | 8/2005 |
| DE | 10 2004 009 267 B3 | 9/2005 |
| DE | 10 2004 038 847 B3 | 9/2005 |
| DE | 10 2004 040 079 B3 | 12/2005 |
| DE | 10 2005 037 905 A1 | 3/2006 |
| DE | 10 2004 053 551 A1 | 5/2006 |
| DE | 10 2006 008 257 A1 | 10/2006 |
| DE | 10 2006 021 774 A1 | 1/2007 |
| DE | 10 2005 038 655 B3 | 3/2007 |
| DE | 10 2005 040 539 B4 | 3/2007 |
| DE | 10 2005 052 688 A1 | 5/2007 |
| DE | 10 2006 007 770 A1 | 8/2007 |
| DE | 10 2006 028 698 | 12/2007 |
| EP | 0 539 081 | 4/1993 |
| EP | 0 710 850 | 5/1996 |
| EP | 1 720 027 A | 11/2006 |
| JP | 57187671 | 11/1982 |
| JP | 42 12 737 C1 | 8/1992 |
| JP | 2000 174358 | 6/2000 |
| JP | 2001 345498 A | 12/2001 |
| JP | 2002 353418 | 12/2002 |
| JP | 2003 179283 A | 6/2003 |
| JP | 2003 525528 | 8/2003 |
| JP | 2004 117367 A | 4/2004 |
| JP | 2006 126087 | 5/2006 |
| WO | WO 2004/109725 | 12/2004 |
| WO | WO 2005/064357 A | 7/2005 |
| WO | WO 2006/040719 A | 4/2006 |
| WO | WO 2006/136577 A1 | 12/2006 |
| WO | WO 2007/147760 A2 | 12/2007 |

OTHER PUBLICATIONS

PCT Search Report and Written Opinion of the ISA for PCT/US2005/029982 dated Jan. 18, 2006.

Takenaga et al.: "High-Temperature Operations of Rotation Angle Sensors With Spin-Valve-Type Magnetic Tunnel Junctions;" IEEE Transactions on Magnetics; vol. 41, No. 10; Oct. 2005; pp. 3628-3630.

Image File Wrapper for U.S. Appl. No. 11/876,048 filed on Oct. 22, 2007, entitled: "Matching of GMR Sensors In A Bridge," downloaded on May 12, 2010; Part 1 of 3; 315 pages.

Image File Wrapper for U.S. Appl. No. 11/876,048 filed on Oct. 22, 2007, entitled: "Matching of GMR Sensors In A Bridge," downloaded on May 12, 2010; Part 2 of 3; 286 pages.

Image File Wrapper for U.S. Appl. No. 11/876,048 filed on Oct. 22, 2007, entitled: "Matching of GMR Sensors In A Bridge," downloaded on May 12, 2010; Part 3 of 3; 288 pages.

European Official Communication dated Apr. 25, 2008 for EP 05794713.7.

Response dated Nov. 5, 2008 to European Official Communication dated Apr. 25, 2008 for EP 05794713.7.

European Official Communication dated Oct. 2, 2009 for EP 05794713.7.

Response dated Apr. 12, 2010 to European Official Communication dated Oct. 2, 2009 for EP 05794713.7.

PCT International Preliminary Examination Report dated Apr. 17, 2007 for PCT/US2005/029982 filed on Aug. 22, 2005.

Data Sheet; "High-Speed Digital Isolators, AduM1100AR/AduM1100BR;" as published by Analog Devices, Inc.; 2001, pp. 1-12.

"Utilization of GMR Materials. Analog Bridge Output Devices;" pp. 1-3; NVE Corporation on website: www.nve.com/technical/explinations//Bridge.html.

Daughton et al.; "Magnetic Field Sensors Using GMR Multilayer", IEE Transactions on Magnetics, IEEE Service Center, New York, NY, US, vol. 30, No. 6, Nov. 1, 1994, p. 4608-4610, XP000674135. isn: 0018-9464, the whole document; figure 4.

Prinz; "Magnetoelectronics Applications" Journal of Magnetism and Magnetic Materials, Elsevier Science Publishers, Amsterdam, NL, vol. 200, No. 1-3, Oct. 1, 1999, pp. 57-68, XP004364006. ISSN: 0304-8853, p. 59; figure 3.

Spong et al.; "Giant Magnetoresistive Spin Valve Bridge Sensor", IEEE Transactions on Magnetics, IEEE Service Center, New York, NY, US, vol. 32, No. 2, Mar. 1, 1996, pp. 366-371, XP011030196; ISSN:0018-9464; the whole document.

Letter from Japanese attorney dated Apr. 12, 2010, translating Japanese Office Action dated Feb. 19, 2010 for JP2007-536689 filed on Apr. 12, 2007.

PCT Search Report and the Written Opinion of the ISA for PCT/US2008/075556 dated Dec. 30, 2008, 19 pages.

PCT International Preliminary Examination Report dated April 27, 2010 for PCT/US2008/075556 filed on Sep. 8, 2008.

* cited by examiner

RESISTOR HAVING A PREDETERMINED TEMPERATURE COEFFICIENT

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to electrical resistors and, in particular, to an electrical resistor having a predetermined temperature coefficient selected in accordance with a temperature coefficient of a magnetoresistance element.

BACKGROUND OF THE INVENTION

Magnetoresistance elements are known to be manufactured in a variety of configurations, including, but not limited to giant magnetoresistance (GMR) elements, and anisotropic magnetoresistance (AMR) elements.

Referring to FIG. 1, a prior art GMR element 10 is formed having a plurality of layers, including an antiferromagnetic layer 12, a first pinned layer 14, a first non-magnetic layer 16, a second pinned layer 18, a second non-magnetic layer 20, and a free layer 22. In one conventional GMR element, the antiferromagnetic layer 12 comprises PtMn, the first and second pinned layers 14, 18 are comprised of CoFe, the first and second non-magnetic layers 16, 20 are comprised of a selected one of Ir and Ru, and the free layer 22 is comprised of NiFe. However, one of ordinary skill in the art will understand that other layers and materials can be provided in a GMR element.

The magnetoresistance element is used in a variety of applications, including, but not limited to current sensors responsive to an electrical current, proximity detectors responsive to proximity of a ferromagnetic object, for example, ferrous gear teeth, and magnetic field sensors responsive to a magnetic field external to the magnetic field sensor.

In each of the above applications, one or more magnetoresistance elements can be coupled either in a simple resistor divider or in a Wheatstone bridge arrangement. In either the resistor divider arrangement or in the Wheatstone bridge arrangement, one or more fixed resistors can also be used along with the one or more magnetoresistance elements. The resistor divider and the Wheatstone bridge arrangement each provide an output voltage signal proportional to a magnetic field experienced by the one or more magnetoresistance elements.

The magnetoresistance element has an electrical resistance that changes generally in proportion to a magnetic field in a direction of a maximum response axis of the magnetoresistance element. However, the electrical resistance changes not only in proportion to the magnetic field, but also in proportion to a temperature of the magnetoresistance element. The affect of temperature can be characterized as a temperature coefficient in units of resistance per degree temperature.

It will be recognized that the temperature coefficient of the magnetoresistance element, when used in a resistor divider or in a Wheatstone bridge arrangement, can adversely affect the expected output voltage signal of the resistor divider or the Wheatstone bridge. In particular, if the one or more resistors used in conjunction with the one or more magnetoresistance elements do not have the same temperature coefficient as the one or more magnetoresistance elements, then the output voltage signal of the resistor divider and the Wheatstone bridge arrangement will be responsive not only to a magnetic field, but also to temperature changes.

An open loop arrangement of a current sensor, a proximity detector, or a magnetic field sensor is a known circuit arrangement in which one or more magnetic field sensing elements are exposed to a magnetic field generated external to the circuit. A closed loop arrangement of a current sensor, a proximity detector, or a magnetic field sensor is a known circuit arrangement in which one or more magnetic field sensing elements are exposed to both a magnetic field generated external to the circuit and also to an opposing magnetic field generated by the circuit, so as to keep the resulting magnetic field in the vicinity of the one or more magnetic field sensing elements near zero. The closed loop arrangement has certain known advantages over the open loop arrangement, including, but not limited to, improved linearity. Conversely, the open loop arrangement has certain known advantages over the closed loop arrangement, including, but not limited to, improved response time.

SUMMARY OF THE INVENTION

The present invention provides a material stack forming a resistor having a temperature coefficient the same as or similar to the temperature coefficient of a giant magnetoresistance (GMR) element.

In accordance with the present invention, a material stack includes an antiferromagnetic layer, a first pinned layer disposed over the antiferromagnetic layer, a non-magnetic layer disposed over the pinned layer, and a second pinned layer disposed over the non-magnetic layer. The material stack has an electrical resistance generally the same in the presence of a magnetic field and in the presence of no magnetic field, and the electrical resistance has a temperature coefficient generally the same as a temperature coefficient of a magnetoresistance element.

With this particular arrangement, the material stack provides an electrical resistance generally the same as that of a magnetoresistance element even when exposed to temperature variations.

In accordance with another aspect of the present invention, a circuit includes a giant magnetoresistance element and a material stack as described above. In particular embodiments, the circuit can be a voltage divider, a Wheatstone bridge arrangement, a current sensor responsive to an electrical current, a proximity detector responsive to proximity of a ferromagnetic object, and a magnetic field sensor responsive to magnetic fields external to the circuit.

With this particular arrangement, the circuit can provide an output signal responsive to a magnetic field but generally unresponsive to temperature changes.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the resistor of the present invention, some introductory concepts and terminology are explained. As used herein, the term "disposed over" is used to refer to a relative placement, without suggesting a requirement for up or down orientation. For example, a first layer in combination with a second layer disposed over the first layer is not meant to require that the second layer be above the first layer. Merely by flipping the above-described combination, it can be seen that the second layer can be either above or below the first layer. The term "disposed over" also does not suggest a requirement for physical contact. For example, the above-described first and second layers need not be touching.

Figure 1:
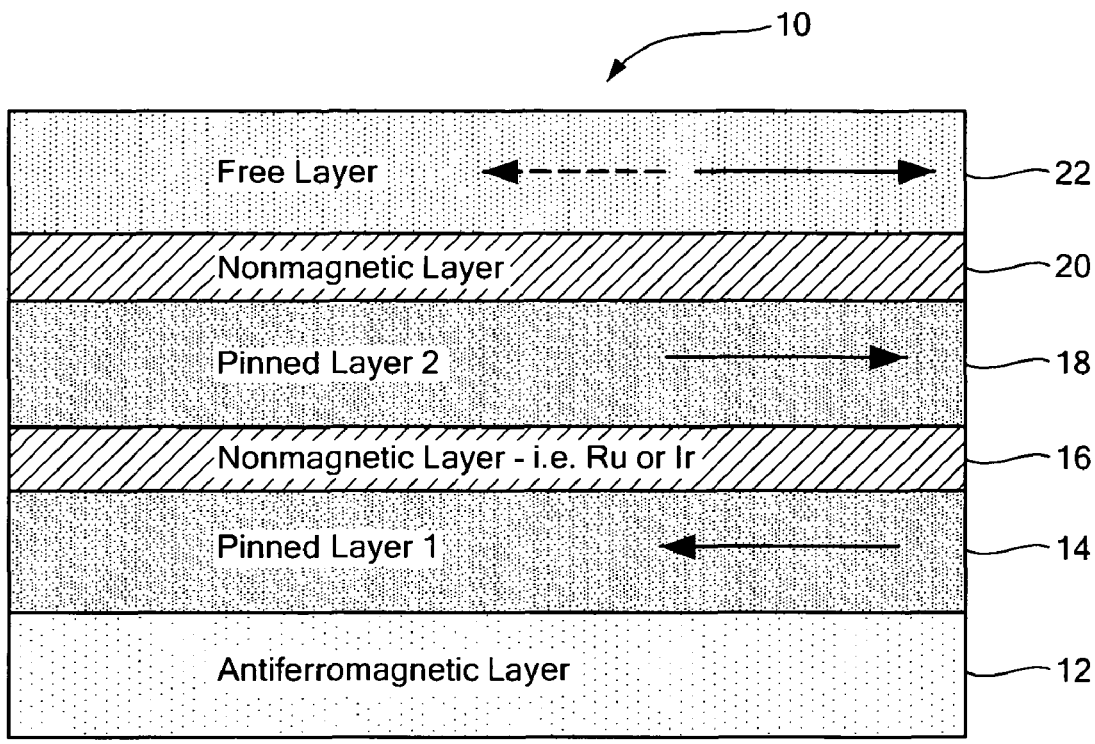
FIG. 1 is a diagram showing layers of a prior art giant magnetoresistance (GMR) element.
Figure 2:
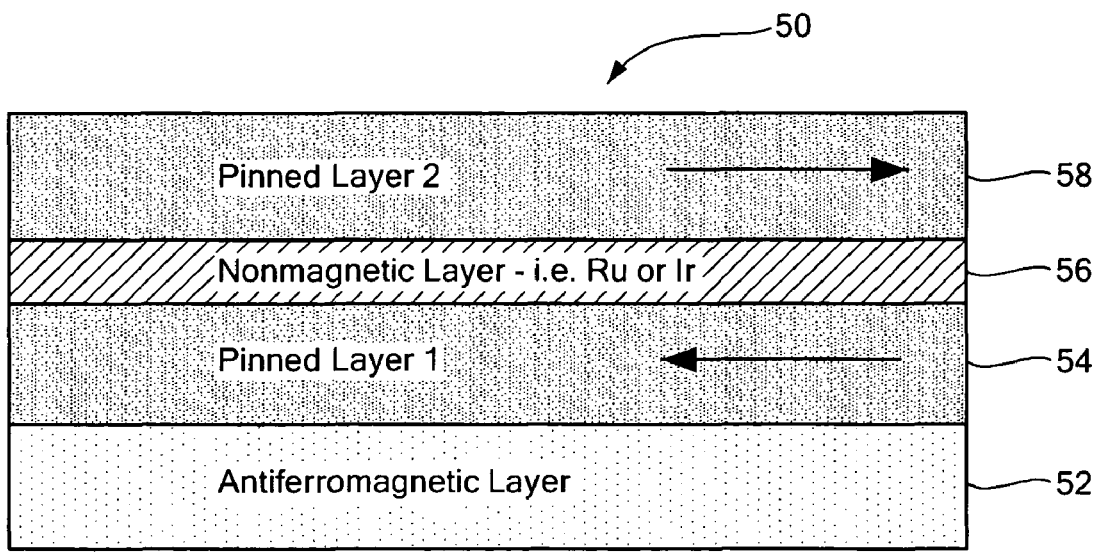
FIG. 2 is a diagram showing layers of a material stack forming a resistor in accordance with the present invention.

Referring to FIG. 2, an exemplary resistor 50 having a predetermined temperature coefficient is provided as a material stack including an antiferromagnetic layer 52, a first pinned layer 54, a non-magnetic layer 56, and a second pinned layer 58. The antiferromagnetic layer 52 comprises PtMn, the first and second pinned layers 54, 58 are comprised of CoFe, and the non-magnetic layer 56 comprises a selected one of Ir and Ru. It will be recognized that the resistor 50 has most of the layers of the magnetoresistance element 10 of FIG. 1. However, the second non-magnetic layer 20 and the free layer 22 of FIG. 1 are not present in the resistor 50. Therefore, the resistor 50 is not responsive to a magnetic field. However, the resistor 50 has a temperature coefficient the same as or similar to the temperature coefficient of a magnetoresistance element such as the magnetoresistance element 10 of FIG. 1. In an alternate embodiment, a non-magnetic layer (not shown) is provided on top of the second pinned layer 58.

If the resistor 50 has the same width and depth dimensions as the magnetoresistance element 10, the resistor 50 may have a nominal resistance that is different than the nominal resistance of the magnetoresistance element 10 at any particular temperature, while having a temperature coefficient that is generally the same as that of the magnetoresistance element 10. However, in other embodiments, it will be recognized that that the width and the depth of the resistor 50 can be made to be different than the width and depth of the magnetoresistance element 10 in order to achieve a nominal resistance that is generally the same as that of the magnetoresistance element, while also retaining a temperature coefficient that is generally the same as that of the magnetoresistance element 10. However, in other embodiments, the width and the depth to the resistor 50 can be made to have any dimensions within manufacturing capabilities to achieve any desired resistance.

While the particular material stack 50 having particular layers formed from particular materials is described, it should be recognized that other material stacks can be provided to match other GMR structures, other than the GMR element 10 of FIG. 1, merely by eliminating the associated free layer and an associated non-magnetic layer from the GMR structure in much the same way as provided by the material stack 50.

It should be recognized that, in other embodiments, the non-magnetic layer 56 can be comprised of a plurality of non-magnetic layers, each of the plurality of non-magnetic layers formed from the same or a different material. Thus, as used herein, the term "non-magnetic layer" is used to refer to both a single non-magnetic layer and also to a plurality of non-magnetic layers.

In another embodiment, a second non-magnetic layer (not shown) can be provided adjacent to the second pinned layer 58. The second non-magnetic layer can be the same as or similar to the second non-magnetic layer 20 of FIG. 1. In this case, it should be recognized that other material stacks can be provided to match other GMR structures, other than the GMR element 10 of FIG. 1, merely by eliminating the associated free layer from the GMR structure.

In other embodiments, one or more other layers (not shown) can be interposed between the layers 52-58.

Figure 3:
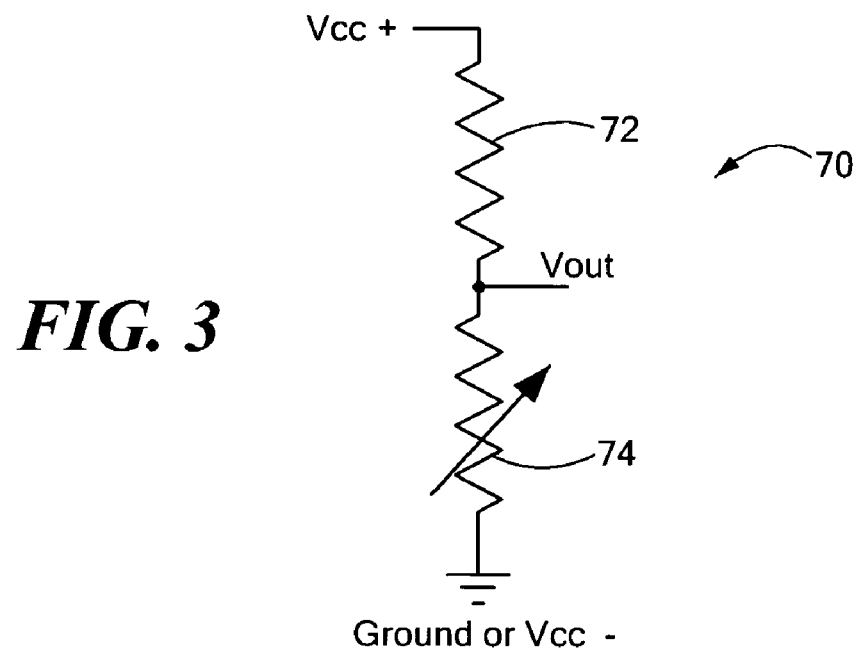
FIG. 3 is a schematic diagram of a resistor divider having a resistor as in FIG. 2.

Referring now to FIG. 3, a voltage divider circuit 70 includes a resistor 72 and a magnetoresistance element 74. The resistor 72 is provided as a material stack as shown, for example, as the resistor 50 of FIG. 2.

Since the resistor 72 has the same temperature coefficient as the magnetoresistance element 74, an output voltage, Vout, of the resistor divider 70 is generally not responsive to temperature. However, the output voltage, Vout, is responsive to a magnetic field in the vicinity of the magnetoresistance element 74.

Figure 4:
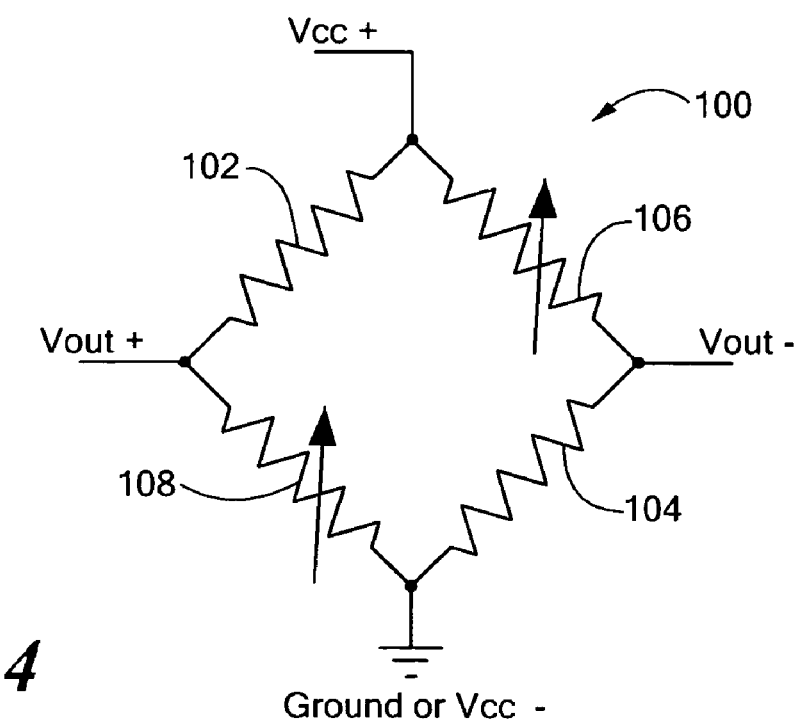
FIG. 4 a schematic diagram of a Wheatstone bride having two resistors as in FIG. 2.

Referring now to FIG. 4, a Wheatstone bridge circuit 100 includes first and second resistors 102, 104, respectively and first and second magnetoresistance elements 106, 108, respectively. The first and second resistors 102, 104 are each provided as a respective material stack as shown, for example, as the resistor 50 of FIG. 2.

Since the resistors 102, 104 have the same temperature coefficient as the magnetoresistance elements 106, 108, an output voltage difference between Vout+ and Vout− of the Wheatstone bridge circuit 100 is generally not responsive to temperature. However, the output voltage difference is responsive to a magnetic field in which the magnetoresistance elements 106, 108 are placed.

Figure 5:
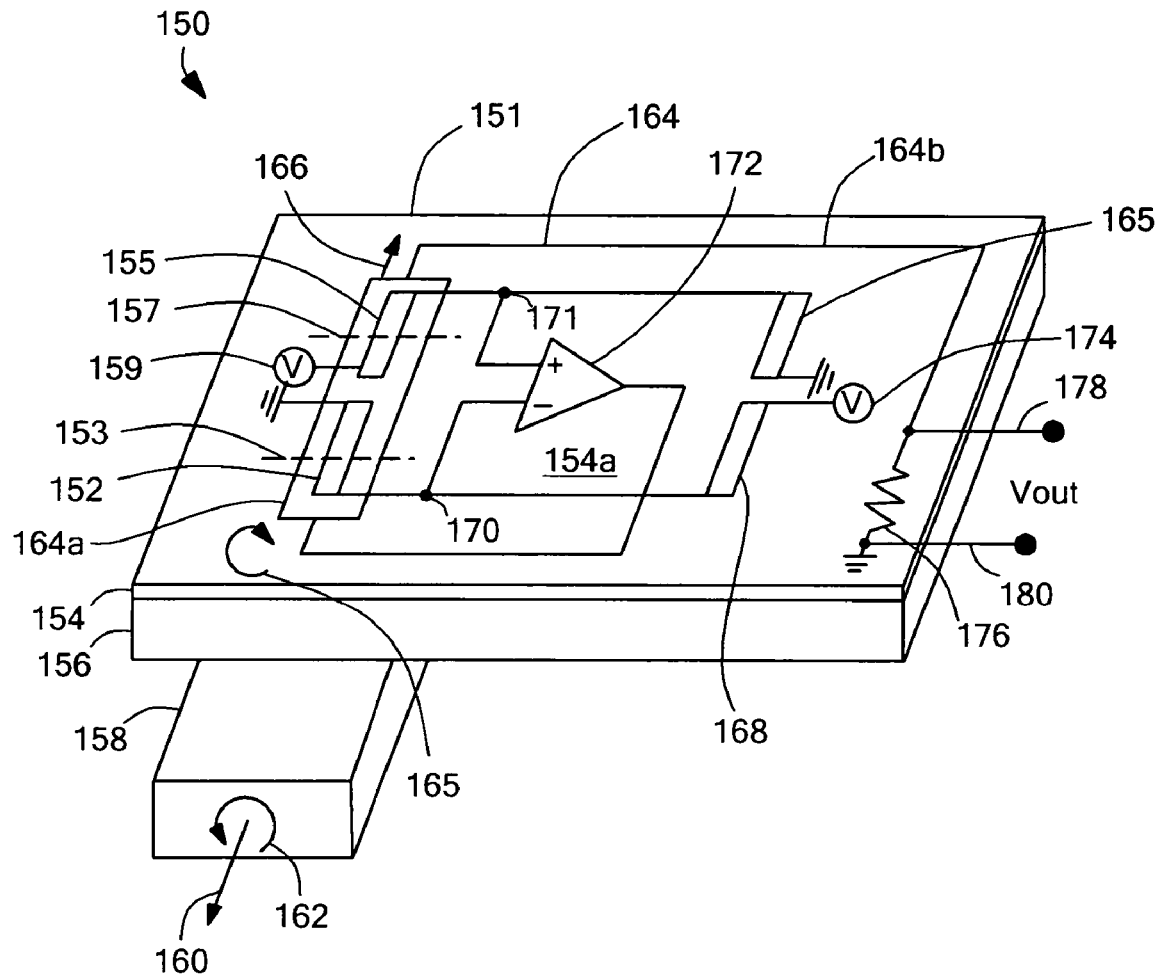
FIG. 5 is a pictorial of a current sensor having two resistors as in FIG. 2.

Referring now to FIG. 5, an electronic circuit 150 in the form of a closed loop current sensor is shown. The current sensor 150 contains first and second magnetoresistance elements 152, 155, respectively, and first and second resistors 168, 165, respectively. The resistors 168, 165 are each fabricated as a material stack in accordance with the resistor 50 of FIG. 2. The magnetoresistance elements 152, 155 and resistors 168, 165 are disposed over a surface 154a of a silicon substrate 154. A secondary conductor 164 is also disposed over the surface 154a of the silicon substrate 154 proximate to the magnetoresistance elements 152, 155. A further, primary, conductor 158 is isolated from the silicon substrate 154 by a dielectric 156, as shown.

In operation, a primary current 160 flows through the primary conductor 158, thereby generating a primary magnetic field 162. A secondary current 166 flows through the secondary conductor 164, thereby generating a secondary magnetic field 165 at the conductor portion 164a. Because the secondary current 166 passes through the secondary conductor portion 164a in a direction opposite to the primary current 160 passing through the primary conductor 158, the secondary magnetic field 165 is opposite in direction to the primary magnetic field 162.

A first voltage source 174, here integrated in the silicon substrate 154, provides a current through the first resistor 168 and the first magnetoresistance element 152 and, therefore, generates a voltage at node 170 having a magnitude related to the magnetic field experienced by the first magnetoresistance element 152. Similarly, a second voltage source 159, also here integrated in the silicon substrate 154, provides a current through the second magnetoresistance element 155 and the second resistor 165 and, therefore, generates a voltage at node 171 having a magnitude related to the magnetic field experienced by the second magnetoresistance element 155. In one particular embodiment, the first and the second voltage sources 174, 159 supply the same voltage and are provided by a single voltage source. An amplifier 172, coupled to the nodes 170, 171, provides the secondary current 166 to the secondary conductor 164 in response to the voltage difference between the nodes 170 and 171.

The first magnetoresistance element 152 has a response axis 153, and the second magnetoresistance element 155 has a response axis 157. The magnetoresistance elements 152, 155 are polarized in the same direction. The secondary current 166 passes by the first and second magnetoresistance elements 152, 155 in the same direction. Therefore, when exposed to the secondary magnetic field 165 the voltages at nodes 170, 171 move in response to the magnetic field in opposite directions.

In the particular arrangement shown, the node 170 is coupled to a negative input of the amplifier 172 and the node 171 is coupled to a positive input of the amplifier 172. The amplifier 172 generates the secondary current 166 in proportion to the voltage difference between nodes 170 and 171. The voltage at the node 171 tends to increase in response to the primary magnetic field 162 and the voltage at the node 170 tends to decrease. However, as described above, the secondary magnetic field 165 tends to oppose the primary magnetic field 162.

The magnetic field experienced by the first magnetoresistance element 152 is the sum of the secondary magnetic field 165 and the primary magnetic field 162 along the response axis 153. Similarly, the magnetic field experienced by the second magnetoresistance element 155 is the sum of the secondary magnetic field 165 and the primary magnetic field 162 along the response axes 157. Since the secondary magnetic field 165 is opposite in direction to the primary magnetic field 162, the secondary magnetic field 165 tends to cancel the primary magnetic field 162.

The amplifier 172 provides the secondary current 166 at a level necessary to generate the secondary magnetic field 165 sufficient to cancel the primary magnetic field 162 along the response axes 153, 157 so that the total magnetic field experienced by the first and second magnetoresistance elements 152, 155 is substantially zero gauss.

The secondary current 166 passes through a resistor 176, thereby generating an output voltage, Vout, between output terminals 178, 180 in proportion to the secondary current 166. With this arrangement, the output voltage, Vout, is proportional to the secondary magnetic field 165, and is thus proportional to the primary current 160, as desired.

It will be understood that the resistor 176 has a resistance with a temperature coefficient. One of ordinary skill in the art will recognize techniques that can be used to reduce the affect of this temperature coefficient. For example, an operational amplifier circuit with a properly matched feedback compensation network can be used reduce the affect.

The two magnetoresistance elements 152, 155 and the two resistors 168, 165 provide a Wheatstone bridge circuit as shown, for example, in FIG. 4. It should be appreciated that, since the resistors 168, 165 are provided as material stacks in accordance with the resistor 50 of FIG. 2, having a temperature coefficient essentially the same as the temperature coefficients of the magnetoresistance elements 152, 155, the voltage difference between the nodes 170, 171 will be essentially unaffected by temperature changes, and therefore, the output voltage, Vout, will be similarly unaffected.

It will be appreciated by those of ordinary skill in the art that while the closed loop current sensor 150 has two magnetoresistance elements 152, 155, and two resistors 168, 125, alternative closed loop current sensors can be provided with more than two or fewer than two magnetoresistance elements and more than two or fewer than two resistors.

While the silicon substrate 154 is shown, it will also be apparent that other substrate materials, including but not limited to, SiGe, GaAs, or InGaAs can be used in place of the silicon substrate 154 without departing from the present invention. Also, in an alternate embodiment, the silicon substrate 154 can be replaced by another substrate (not shown) comprised of a ceramic material, including but not limited to $Al_2O_3$. In this particular embodiment, a magnetoresistance element and a resistor formed as a material stack in accordance with the resistor 50 of FIG. 2 can be fabricated on the ceramic substrate. Circuitry similar to the amplifier 171 can be formed, for example, on a separate substrate (not shown), for example, on a silicon substrate, which can be coupled with wire bonds or the like to the ceramic substrate.

Figure 6:
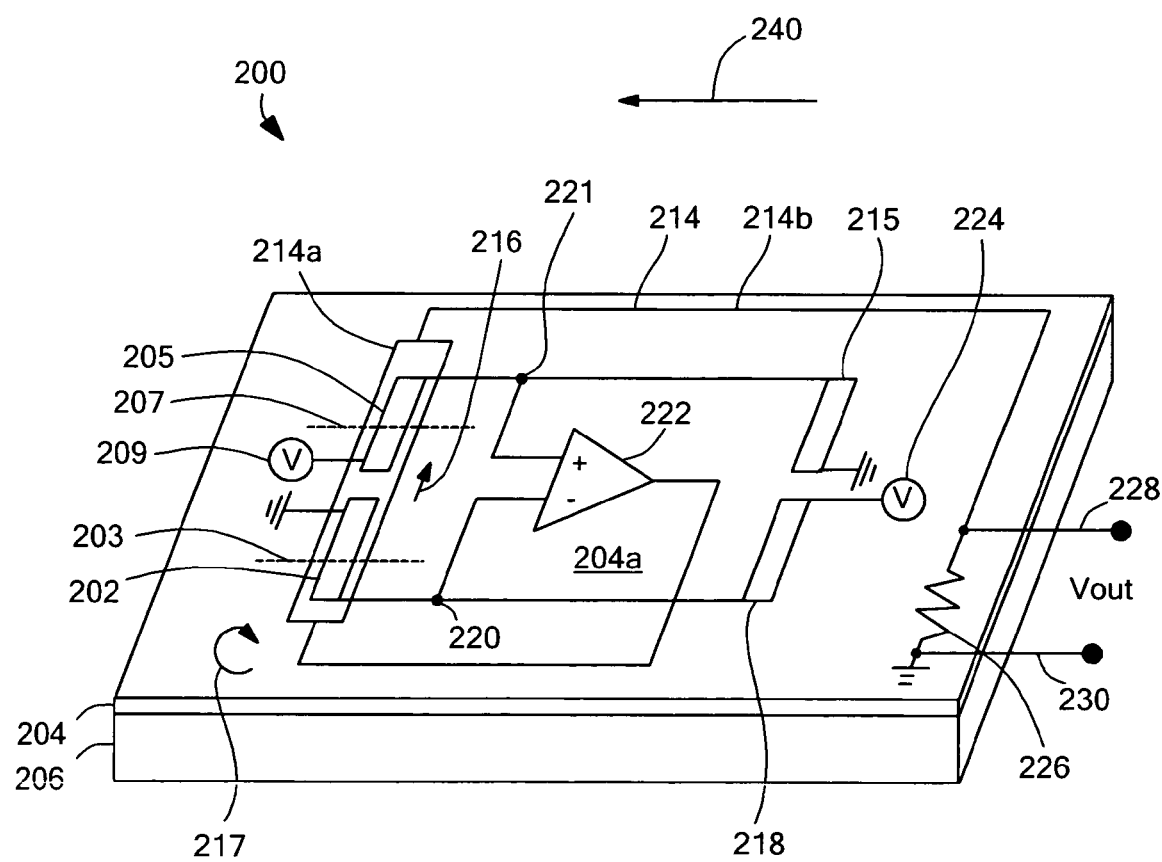
FIG. 6 is a pictorial of a magnetic field sensor having two resistors as in FIG. 2.

Referring now to FIG. 6, an electronic circuit 200 in the form of a magnetic field sensor includes a silicon substrate 204, first and second magnetoresistance elements 202, 205, respectively and first and second resistors 218, 215, respectively, disposed over a surface 204a of the silicon substrate 204. A conductor 214 is also disposed over the surface 204a of the silicon substrate 204 proximate to the magnetoresistance elements. The first and second resistors 218, 215 are provided as material stacks in accordance with the material stack 50 of FIG. 2. The magnetic field sensor 200 is adapted to sense are external magnetic field 240 and to provide an output signal, Vout, proportional to the magnetic field 240.

In operation, a current 216 flows through a first portion 214a of conductor 214, thereby generating a magnetic field 217. The magnetic field 217 is in the opposite direction with respect to the external magnetic field 240. Thus, the magnetic field 217 tends to cancel the external magnetic field 240.

A first voltage source 224, here integrated in the silicon substrate 204, provides a current through the first resistor 218 and the first magnetoresistance element 202, and therefore, generates a voltage at node 220 having a magnitude related to the magnetic field experienced by the first magnetoresistance element 202. Similarly, a second voltage source 209, also here integrated in the silicon substrate 204, provides a current through the second magnetoresistance element 205 and the second resistor 215, and therefore, generates a voltage at node 221 having a magnitude related to the magnetic field experienced by the second magnetoresistance element 205. In one embodiment, the first and the second voltage sources 224, 209 supply the same voltage and are provided by a single voltage source. An amplifier 221 provides the secondary current 216 to the secondary conductor 214 in response to a voltage difference between the nodes 220 and 221.

The first magnetoresistance element 202 has a response axis 203 and the second magnetoresistance element 205 has a response axis 207. The first and second magnetoresistance elements 202, 205 are polarized in the same direction. The current 216 passes by the first and second magnetoresistance elements 202, 205, in the same direction. Therefore, when exposed to the magnetic field 217, the voltage at the node 220 moves in one voltage direction and the voltage at the node 221 moves in the other voltage direction.

In the particular arrangement shown, the node 220 is coupled to a negative input of the amplifier 222 and the node 221 is coupled to a positive input of the amplifier 222. The voltage at the node 221 tends to increase while the voltage at the node 220 tends to decrease in response to the external magnetic field 240. However, as described above, the magnetic field 217 tends to oppose the external magnetic field 240.

The first and second magnetoresistance elements 202, 205 are oriented such that the response axes 203, 207 are aligned with the external magnetic field 240 and also with the magnetic field 217. The magnetic field experienced by the first and second magnetoresistance elements 202, 205 is the sum of the magnetic field 217 and the external magnetic field 240 along the response axes 203, 207 respectively. Since the magnetic field 217 is opposite in direction to the external magnetic field 240 along the response axes 203, 207 the magnetic field 217 tends to cancel the external magnetic field 240. The amplifier 221 generates the current 216 in proportion to the voltage difference between the node 220 and the node 221. Thus, the amplifier 222 provides the current 216 at a level necessary to generate the magnetic field 217 sufficient to cancel the external magnetic field 240 along the response axes 203, 207 so that the total magnetic field experienced by each of the magnetoresistance elements 202, 205 is substantially zero gauss.

The current 216 passes through a resistor 226 thereby generating an output voltage, Vout, between output terminals 228, 230 in proportion to the current 216. With this arrangement, the output voltage, Vout, is proportional to the magnetic field 217 necessary to cancel the external magnetic field 240, and is thus proportional to the external magnetic field 240, as desired.

The two magnetoresistance elements 202, 205 and the two resistors 218, 215 provide a Wheatstone bridge circuit as shown, for example, in FIG. 4. It should be appreciated that, since the resistors 218, 215 are provided as material stacks in accordance with the resistor 50 of FIG. 2, having a temperature coefficient essentially the same as the temperature coefficients of the magnetoresistance elements 202, 205, the voltage difference between the nodes 220, 221 will be essentially unaffected by temperature changes, and therefore, the output voltage, Vout, will be similarly unaffected.

It should be recognized that while the closed loop magnetic field sensor 200 is shown having two magnetoresistance elements 202, 205 and two resistors 218, 215, in an alternate arrangement, a closed loop magnetic field sensor can have more than two or fewer than two magnetoresistance elements and more than two or fewer than two resistors.

While the silicon substrate 204 is shown, it will also be apparent that other substrate materials, including but not limited to, SiGe, GaAs, or InGaAs can be used in place of the silicon substrate 204 without departing from the present invention. Also, in an alternate embodiment, the silicon substrate 204 can be replaced by another substrate (not shown) comprised of a ceramic material, including but not limited to $Al_2O_3$. In this particular embodiment, a magnetoresistance element and a resistor formed as a material stack in accordance with the resistor 50 of FIG. 2 can be fabricated on the ceramic substrate. Circuitry similar to the amplifier 222 can be formed, for example, on a separate substrate (not shown), for example, on a silicon substrate, which can be coupled with wire bonds or the like to the ceramic substrate.

While a closed loop current sensor 150 is shown in FIG. 5 and a closed loop magnetic field sensor 200 is shown in FIG. 6, it will be recognized that open loop arrangements can be provided having resistors formed as material stacks in accordance with the material stack 50 of FIG. 2. Furthermore, a proximity detector, either closed loop or open loop, which is responsive to an external magnetic field generated, for example, by ferrous gear teeth, can also be provided having resistors formed as material stacks in accordance with the material stack 50 of FIG. 2.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A material stack comprising:
   an antiferromagnetic layer;
   a first pinned layer disposed over the antiferromagnetic layer;
   a non-magnetic layer disposed over the pinned layer; and
   a second pinned layer disposed over the non-magnetic layer, wherein the material stack has an electrical resistance substantially the same in the presence of any magnetic field in any direction relative to the material stack and in the presence of no magnetic field, wherein the electrical resistance has a temperature coefficient about the same as a temperature coefficient of a magnetoresistance element, and wherein the material stack does not include a free layer.

2. The material stack of claim 1, wherein the electrical resistance of the material stack also has about the same resistance as an electrical resistance of the magnetoresistance element.

3. The material stack of claim 1, wherein the antiferromagnetic layer comprises PtMn, the first and second pinned layers are comprised of CoFe, and the non-magnetic layer comprises a selected one of Ir or Ru.

4. A circuit comprising:
   a magnetoresistance element; and
   a material stack coupled to the magnetoresistance element, comprising:
   an antiferromagnetic layer;
   a first pinned layer disposed over the antiferromagnetic layer;
   a non-magnetic layer disposed over the pinned layer; and
   a second pinned layer disposed over the non-magnetic layer, wherein the material stack has an electrical resistance substantially the same in the presence of any magnetic field in any direction relative to the material stack and in the presence of no magnetic field, wherein the electrical resistance has a temperature coefficient about the same as a temperature coefficient of the magnetoresistance element, and wherein the material stack does not include a free layer.

5. The circuit of claim 4, wherein the electrical resistance of the material stack also has about the same resistance as an electrical resistance of the magnetoresistance element.

6. The circuit of claim 4, wherein the antiferromagnetic layer comprises PtMn, the first and second pinned layers are comprised of CoFe, and the non-magnetic layer comprises a selected one of Ir or Ru.

7. The circuit of claim 4, wherein the circuit provides a selected one of a voltage divider or a Wheatstone bridge.

8. The circuit of claim 4, wherein the circuit is provided in a selected one of a current sensor, a proximity detector, or a magnetic field sensor, wherein the current sensor is responsive to an electrical current, the proximity detector is responsive to proximity of a ferromagnetic article and the magnetic field sensor is responsive to a magnetic field external to the magnetic field sensor.

9. The circuit of claim 4, wherein the circuit is provided in a current sensor responsive to an electrical current.

10. The circuit of claim 4, wherein the circuit is provided in a magnetic field sensor responsive to a magnetic field external to the magnetic field sensor.

11. The circuit of claim 4, wherein the circuit is provided in a proximity detector responsive to proximity of a ferromagnetic article.

12. The circuit of claim 4, wherein the magnetoresistance element is provided as a giant magnetoresistance (GMR) element.

* * * * *

UNITED STATES PATENT AND TRADEMARK OFFICE
CERTIFICATE OF CORRECTION

PATENT NO. : 7,777,607 B2  
APPLICATION NO. : 10/962889  
DATED : August 17, 2010  
INVENTOR(S) : William P. Taylor et al.

Page 1 of 1

It is certified that error appears in the above-identified patent and that said Letters Patent is hereby corrected as shown below:

Col. 3, lines 48-49, delete "that that" and replace with --that--

Col. 5, line 57, delete "used reduce" and replace with --used to reduce--

Col. 6, line 31, delete "are" and replace with --an--

Signed and Sealed this
Twelfth Day of April, 2011

David J. Kappos
*Director of the United States Patent and Trademark Office*